United States Patent [19]
Hesselbom

[11] Patent Number: 5,963,689
[45] Date of Patent: Oct. 5, 1999

[54] SUBSTRATE EDGE CONNNECTOR

[75] Inventor: Hjalmar Hesselbom, Huddinge, Sweden

[73] Assignee: Telefonaktiebolaget LM Ericsson, Stockholm, Sweden

[21] Appl. No.: 08/994,934

[22] Filed: Dec. 19, 1997

[30] Foreign Application Priority Data

Dec. 19, 1996 [SE] Sweden ................................. 9604689

[51] Int. Cl.[6] ...................................................... G02B 6/26
[52] U.S. Cl. ........................... 385/53; 385/132; 385/147; 439/65; 439/74
[58] Field of Search .................................. 385/53, 54, 55, 385/56, 58, 59, 60, 49, 50, 88, 129–132, 147; 439/65, 67, 74; 174/251

[56] References Cited

U.S. PATENT DOCUMENTS

| | | | |
|---|---|---|---|
| 4,891,014 | 1/1990 | Simpson et al. ........................... | 439/67 |
| 4,972,050 | 11/1990 | Hammond et al. ....................... | 174/251 |
| 5,092,782 | 3/1992 | Beaman ..................................... | 439/65 |
| 5,180,311 | 1/1993 | Schreiber et al. ......................... | 439/74 |
| 5,818,990 | 10/1998 | Steijer et al. ............................. | 385/49 |

*Primary Examiner*—Phan T. H. Palmer
*Attorney, Agent, or Firm*—Burns, Doane, Swecker & Mathis, L.L.P.

[57] ABSTRACT

A combined optical and electrical interconnection means for interconnection of in particular chip modules has an elastic layer of for instance silicone placed over the sharp edge or corner connecting surfaces where the interconnection is made. On the front surface the layer covers an end of an optical waveguide having a core and on the top surface the layer carries an electrically conducting area connected to an electric transmission line. The front surfaces are pressed against each other connecting the ends of the optical waveguides. On the top surface the conducting area is in contact with interconnected electrically conducting areas on a surface of a connector strip. This interconnection structure is able to connect densely located electrical lines and optical waveguides not requiring any fan-out configuration. It is particularly suited for interconnecting compact multi-chip modules and similar devices.

12 Claims, 5 Drawing Sheets

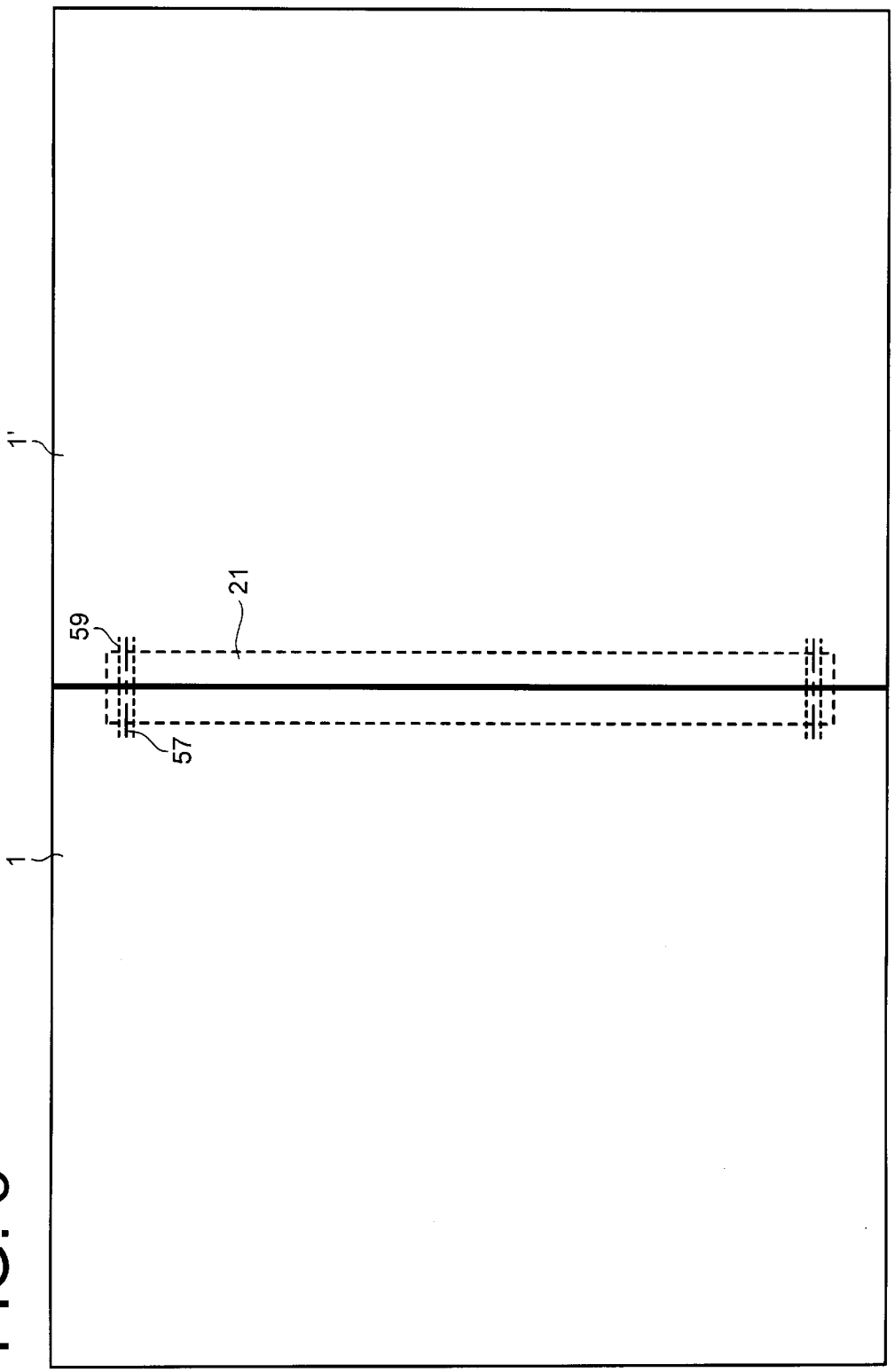

SUBSTRATE EDGE CONNNECTOR

The present invention relates to an edge connector structure for electrical and optical connections, in particular an edge contact element for transferring electrical and optical signals and also to a method of manufacturing such a contact element.

BACKGROUND AND STATE OF THE ART

For connecting complex electronic and optical systems, which tend to become more and more compact, densely packed connection means, which also preserve the signal quality, i.e. which have a good shielding and do not present any reflections, are required. Such connecting means are today manufactured using mainly conventional fine mechanical methods.

However, U.S. Pat. No. 5,180,311 discloses an electrical interconnector comprising electrical conductor paths on a resilient elastomeric member for interconnection of multi-layer printed circuit boards.

U.S. Pat. No. 4,891,014 describes a method for obtaining electrical edge contacts using contact bumps formed on metallic contact pads.

U.S. Pat. No. 5,092,782 describes an integral elastomeric card edge electrical connector for providing shorter signal paths through the contact with reduced interference. The card edge connector is also designed to allow a high density of interconnections between different layers of multi-layer circuit cards without routing signal paths to the card surface.

When electrically connecting two systems, each having a densely packed configuration of electrical conductor paths, the lack of a structure being small enough and having a high density of contacts has become a problem. Also, the size of an individual electrical contact element is important. Thus, it is common that part of the electrical conductor line of a contact element cannot be impedance matched. However, if the portion of the conductor line not being impedance matched is shorter than approximately 1/20 of the wavelength corresponding to the highest frequency of a signal transmitted through the contact, the error imposed by the not impedance part can normally not be detected or will not affect the signal so that the information contents cannot be extracted. Thus, for an electrical contact element interconnecting transmission lines carrying signals having frequencies of 10 GHz and operating at common dielectric constants, the portion of the contact which is not impedance matched must not exceed a distance of approximately 0.5 mm.

For optical contact elements unwanted reflections and attenuation may arise at the end surface of a wave guide where the light signal is to continue to another waveguide and also at the facing end surface of this other waveguide. For minimizing these effects, the waveguides should be well aligned with their facing end surfaces as close to each other as possible. Also, placing an optically transparent homogenous material between the surfaces having a refractive close to those of the waveguides will reduce attenuation.

SUMMARY

It is an object of the present invention to provide an interconnecting structure which can cope with the small dimensions of multi-chip modules or MCMs of today and similar devices and can provide electrical contacts which can maintain the dimensions and spacing of electrical conductor paths of a multi-chip module in the contact and thus through the interconnection.

It is another object of the invention to provide an interconnecting structure which in an impedance matched manner can interconnect transmission lines for electrical signals.

It is another object of the invention to provide an interconnecting structure comprising a contact element for interconnecting simultaneously electrical conductor paths and optical waveguides.

These and other objects are obtained with a structure comprising combined electrical and optical contact elements, which can also be purely electrical or purely optical. The structure solves the problems associated with the prior art.

Thus, a combined connector structure comprises two facing ends of two different optical waveguides. On the surfaces of the two ends elastic layers of a suitable optically transparent material, for instance silicone, are placed. The two ends of the optical waveguides are pressed against each other. An electrical interconnection is also established in the same pressing movement. The electrical connection is obtained as a sliding contact utilizing the same layers of elastic material.

Generally, a combined electrical and optical edge contact is provided for a compact connection of a part to another part. The parts are e.g. substrates and comprise electrical conductors and optical waveguides. The edge contact comprises a layer of an elastic, optically transparent material applied to a first surface, e.g. an end surface, of a part, which for interconnection is to be located at a corresponding first surface of another par. This layer is applied, so that it covers an end surface of an optical waveguide terminating at the surface. It also carries an exposed, electrically conducting area which is connected to an electrical conductor on the part, where the considered layer is located. A connector unit is used having interconnected electrically conducting areas and is placed at the contact so that such an electrically conducting area comes in electrical contact with such an exposed, electrically conducting area of the contact. Positioning means can be provided for accurately positioning the connector unit in the intended position to contact the exposed, electrically conducting area. Such positioning means can comprise bumps, projections or ridges on a substrate cooperating with edges or corners of the connector unit. Also one or more projections on one of the part and the connector unit can be used to cooperate with one or more guide grooves on the other of the part and the connector unit. Also guide pins cooperating simultaneously with grooves both in the part and the unit can be arranged.

The elastic layer preferably covers also a second surface, e.g. a top surface marginal region located at the end surface of the part, located perpendicularly to the first surface, so that the electrically conducting area on the layer is located above this second surface and substantially in parallel therewith. The layer portion carrying the electrically conducting area then provides an elastic, sliding electrical contact with the connector unit, when the part and the connector unit are brought to a position adjacent each other. Further, the layer can continue uninterruptedly from the first surface to the second surface over an edge formed between these surfaces. Several pairs of an electrical conductor and an optical waveguide can be arranged on the part to be connected to conductors and waveguides on another part, and then a separate or individual elastic layer is advantageously arranged for each such pair.

In order to manufacture a contact element an elastic material is applied to regions at the edges of the two different parts, where the interconnection is to be obtained, so that the elastic material covers the interconnection ends of optical waveguides of the two parts. The elastic material can be applied by for example moulding, i.e. the substrate is enclosed in suitable mould and then suitable polymer material is injected into the mould and cured. Then the electrical conductors can be placed on top of the layer of elastic material by deposition to also contact other electrically conducting areas exposed at the surface of the substrate.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

A complete understanding of the invention and of the above and other features thereof may be gained from a consideration of the following detailed description of non-limiting embodiments presented hereinbelow with reference to the accompanying drawings, in which:

FIG. 5 is a view from above of two interconnected three-dimensional multi-chip modules.

DETAILED DESCRIPTION

Figure 1:
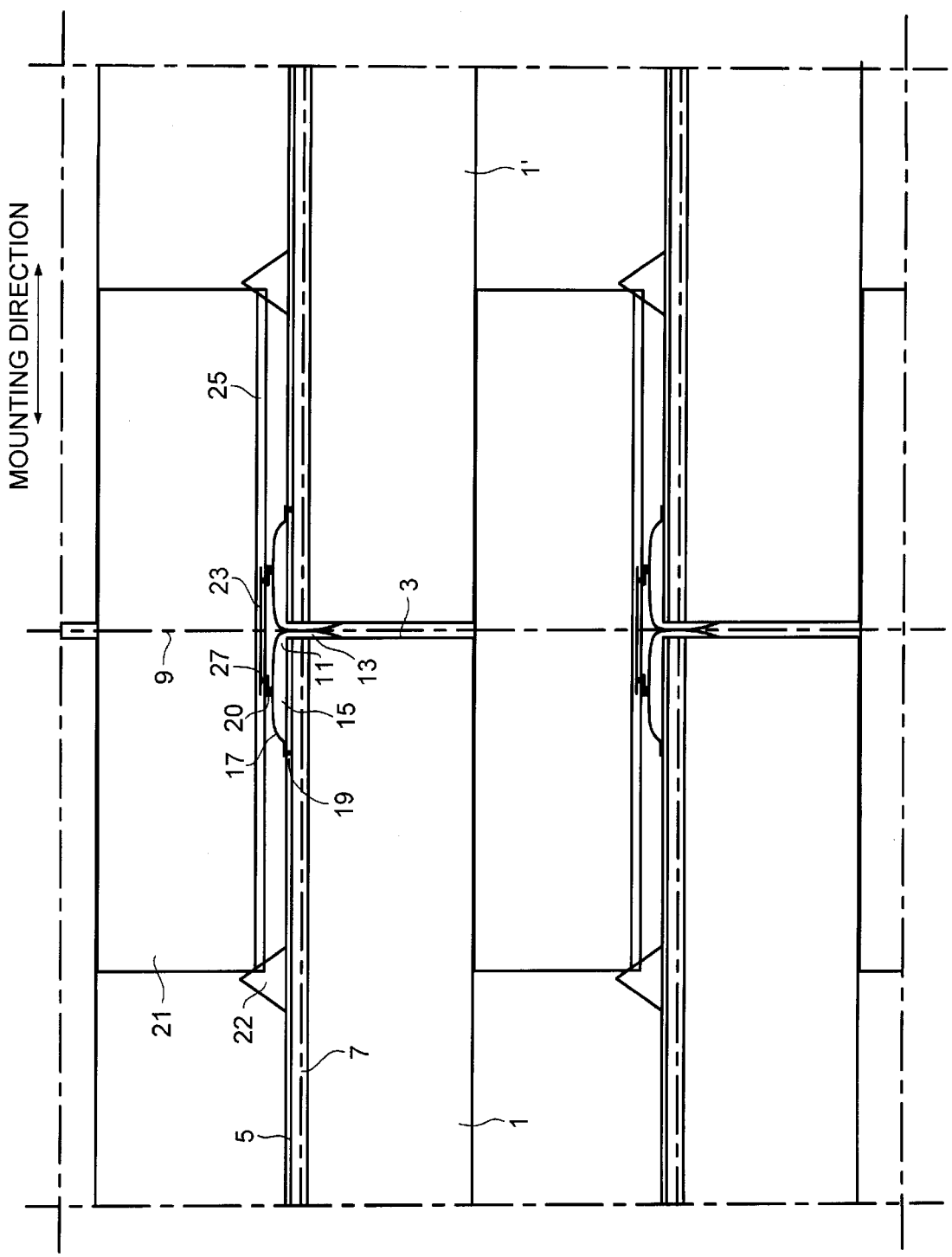
FIG. 1 is a cross-sectional view of the interconnection region of a three-dimensional multi-chip module to a similar, neighbouring three-dimensional multi-chip module illustrating substrate edge interconnector elements as seen perpendicularly to the direction, in which the components are moved to complete the connection.

In FIG. 1 the interconnection of two three-dimensional or multi-layered multi-chip modules placed side by side is shown as a sectional view from the side. Each three-dimensional multi-chip module comprises a stack of substrates 1, 1' having the shape of thin plates which carry integrated circuit chips, not shown, connected by electrical conductor paths, not shown, in and at the substrates. The substrates 1, 1' of the three-dimensional multi-chip modules are all located on top of each other to have lateral side or edge surfaces 3 located in substantially the same plane perpendicular to the large surfaces of the substrates. The substrates 1, 1' have marginal portions both at their top and bottom surfaces where no components are connected and where instead signals propagating in the substrates are coupled from one substrate to a neighbouring substrate in an adjacent three-dimensional multi-chip module. In particular two substrates, a left substrate 1 of a left three-dimensional multi-chip module and a right substrate 1' of a right three-dimensional multi-chip module, are located with their narrow lateral side or edge surfaces 3 close to each other and facing each other to be connected electrically and also optically. In particular the top surfaces of the substrates 1, 1' are located in substantially the same plane. Each of the substrates 1, 1' has electrical conductor paths or transmission lines 5 and optical waveguides having cores 7 at or in their top large surfaces. The conductor paths 5 and the cores can extend substantially perpendicularly to the end surfaces of the substrates 1, 1', at least in regions close to the end surfaces 3. Electrical conductor paths 5 of each substrate 1, 1', which have their ends located opposite each other, are thus to be connected electrically for e.g. transmitting signals. In the same way there are optical waveguides in each pair of neighbouring substrates 1, 1' which have their end surfaces located opposite each other, as considered with respect to the border plane 9 between the three-dimensional multi-chip modules 1, 1'. Thus the end surfaces of the waveguide cores 7 face each other and these waveguides are to be connected optically to each other in order to be capable of transmitting light waves along them, from one substrate past the border plane 9 to the other one. Generally, an electric transmission line 5 is assumed to be located, at least in the region adjacent the substrate edge, directly above and in parallel with a waveguide having a core 7, two such signal lines sharing common coupling means, as will be described hereinafter.

At the upper edges, as seen in a cross-sectional view like that of FIG. 1, i.e. at the upper areas of the edge surfaces 3 of the substrates 1, 1' and at the areas of top surfaces located at the edge, where the connection is to be made, i.e. at the surface at which the electrical conductors 5 are located, elastic and electrically isolating coatings 11 made of a polymer material, preferably silicone, are located. Such a coating 11 thus forms an elastic thin layer 13 in the shape of a low bump or ridge on the edge surface 3 and an elastic bump 15 or ridge on the top surface of a substrate 1, 1', these bumps 13, 15 being connected by silicone material also covering the sharp 90°-edges of the substrates 1, 1'.

Opposite optical transmission lines symbolized by the waveguide cores 7 are connected through the medium of the corresponding opposite edge bumps 13, which are pressed against each other, so that these two bumps 13 or elastic layers pressed together will optically behave as one single body. The silicone bumps 13 here serve two purposes. Firstly, the elastic nature of the silicone will assist in removing air present between the edge surfaces of the two substrates 1, 1', so that no air gaps or air bubbles are formed in the propagation path of a light wave. Secondly, if a multitude of optical waveguides are located in parallel to each other and terminate at the same edge surface to be connected to corresponding optical waveguides, the edge surfaces may not be completely flat or not completely parallel to each other, so that there are varying distances from the end of a waveguide to the opposite waveguide. Then, when placing two three-dimensional multi-chip modules at each other for making an interconnection, the elastic layers of silicone or the elastic silicone bumps 13 will be compressed to a varying extent to each other and they will still optically behave as one single body. This means that they will couple a propagating light wave with small attenuation from one end surface to the opposite one. This is particularly true in the case where the refractive index of the elastic silicone material used is chosen close to the refractive index of the optical waveguide layers, where the distance between the substrate end surfaces is small and where the two optical waveguides are well aligned. Generally thus, the ends of the optical waveguides do not need to be polished to an optical surface finishing what simplifies the production of the substrates 1, 1'.

Electrical conductor paths 17 extend on the inner side surface of the top bumps 15 up to the top of bumps and are connected to the regular electrical conductors 5 at the substrate top surfaces by means of vias 19. For achieving good electrical contact characteristics, these conductor paths 17 are preferably made of gold. On the top of the bumps 15 the electrical conductors 17 contact electrically conducting areas 20 on a connector substrate 21. Such a connector substrate 21 has a general shape of an elongated rectangular body or the shape of a strip, see also the plan view of FIG. 5 illustrating two interconnected three-dimensional multi-chip modules. The connector substrate is generally symmetric, both in its geometrical shape and its electrical characteristics, in regard of the border plane 9 between the two three-dimensional multi-chip modules or of a longitudinal axis of the connector body 21, this axis being then located in the border plane 9. The connector substrate 21 has a height adapted to the interspace between substrates 1, 1' in each three-dimensional multi-chip module, so that it with its top surface is in contact with the bottom surfaces of two adjacent substrates from different three-dimensional multi-chip modules and with its bottom surface is in contact with the top surfaces of two adjacent substrates 1, 1' also from different three-dimensional multi-chip modules, in particular in contact with the top bumps 15. Further, the connector substrate 21 is maintained in a proper symmetrical position in relation to the border plane 9 by means of bumps or ridges 22 attached to the top surfaces of the substrates 1, 1' and cooperating with the lower longitudinal corners of the connector substrate 21. The positioning bumps or ridges 22 can have a generally triangular cross-section.

The connector strip 21 has electrical conductors 23 embedded in a dielectric and electrically isolating material 25, for example benzocyclobutene BCB, applied to its lower surface, the electrical conductors 23 extending past and equally on both sides of the border line 9, generally perpendicularly to the border plane 9 and the longitudinal axis of the connector part 21. Such an electrical conductor 23 is connected to electrically conducting vias 27 on each side of the border line 9. These vias 27 connect to the electrically conducting surface areas 20 on the bottom surface of the connector substrate 21. Thereby, two such opposite conducting surface areas 20 are electrically connected to each other. Further, by the contact of the electrical conductor 17 on the top bumps 15 and the conductive areas 20 on the bottom surface of the connector substrates 21 an electrical path is established between the electrical conductors 5 arriving to the considered margin areas of the two substrates 1, 1'. This electrical contact is obtained by the elastic nature of the coatings 11 and thus of the top bumps 15 and by giving the connector substrates 21 a suitable height, so that the top bumps 15 are at least a little compressed, when the connector substrates 21 are mounted in their proper position between stacked substrates 1, 1'.

Figure 2:
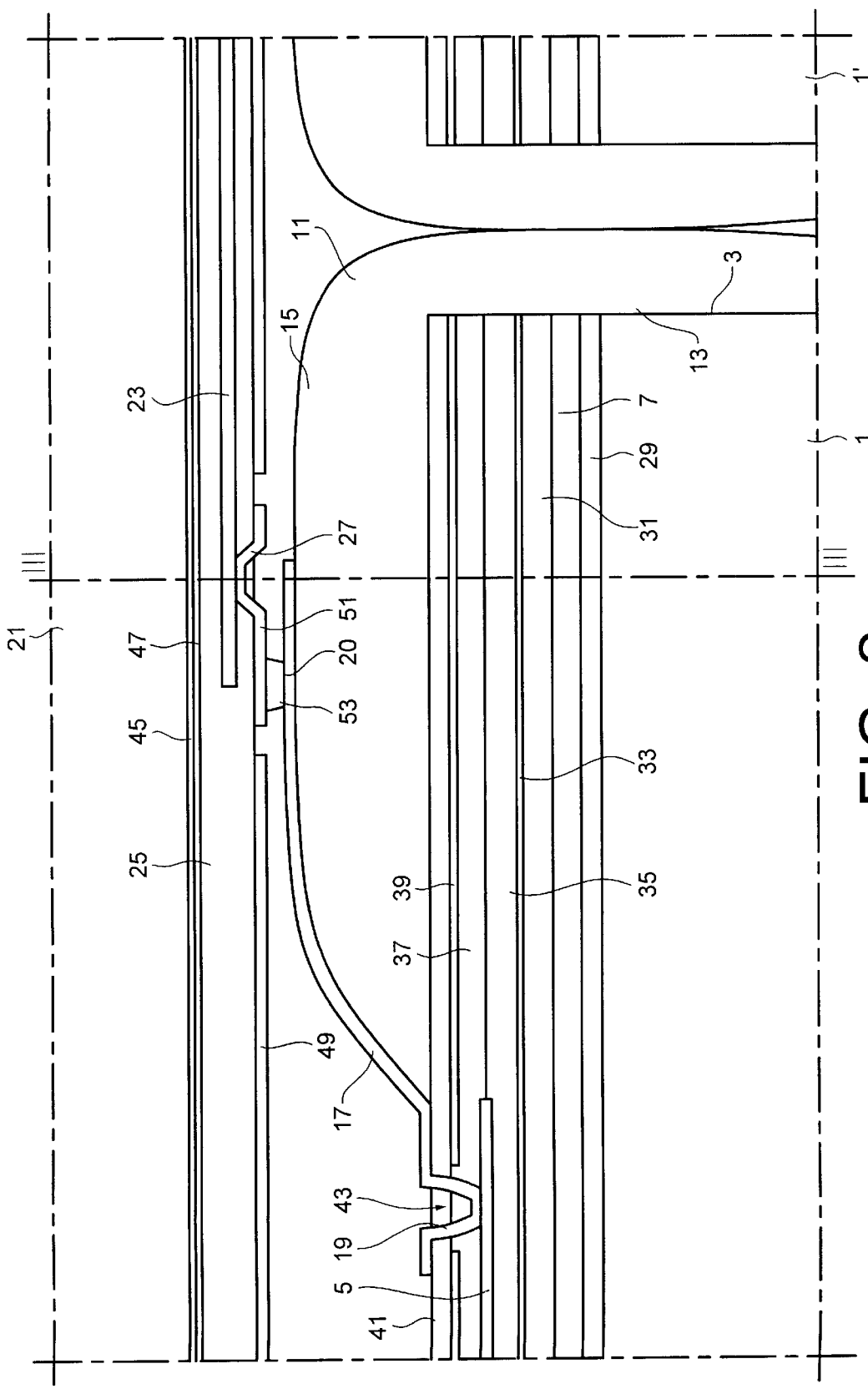
FIG. 2 is a cross-sectional view similar to that of FIG. 1 but showing a small portion of the interconnection region of FIG. 1 in a larger scale.

The elastic layer structure and the electrical and optical connections are illustrated in detail in FIG. 2, which shows the contact area of the elastic material of FIG. 1 in a larger scale. The substrates 1, 1' can be assumed to be made from monocrystalline silicon and have at their top surfaces the structure forming an optical waveguide by means of the core 7 and an undercladding 29 and an overcladding 31 surrounding the core 7. These different parts can be made of suitable inorganic or organic materials, such as silicon dioxide or polymers having suitably chosen refractive indices for forming the intended waveguide. On top on the waveguide an electrically conducting layer 33 is provided, which is a first ground layer and is intended to be connected to signal ground when using the interconnected substrates 1, 1'. The first ground layer 33 is part of a high-frequency transmission line having the electrical conductor 5 at its core. Thus, dielectric layers 35, 37 are located on top of the first ground layer 33 and surround the electrical conductor 5. An electrically conducting layer 39 on top of the upper dielectric layer 37 forms a second ground layer for constituting the transmission line. By selecting the thicknesses and dielectric constants of the dielectric layers 35, 37 the transmission line can be impedance matched. Finally, the upper, exterior surface of the substrates 1, 1' is formed by an electrically isolating, polymer coating 41, on top of which the top bumps 15 of the elastic coatings 11 are placed. The material of the isolating and/or dielectric layers 35, 37, 41 can for example be the polymer benzocyclobutene BCB.

The vias 19 connecting the signal conductors 5 of the transmission lines to the electrical conductors 17 extending up onto the top surface of the top bumps 15 are here shown to be formed by electrically conductive coatings on the walls and the bottom of a hole 43 extending down to the signal conductors 5 from the top surface of the substrates 1, 1'. The upper or second ground layer 41 does not extend up to the hole 43 but has in this region sufficiently large holes, so that there is no risk for the via conductive coatings 19 to come in electrical contact with this ground layer 41.

The connector substrate 21 carries at its bottom surface first an electrically isolating, thin layer 45. Then again a high-frequency transmission line is formed by the electrical conductor 23 working as the signal line interconnecting the areas above each substrate 1, 1'. An upper electrically conducting layer 47 is thus located at the bottom surface of the isolating layer 45 forming a first ground layer and at the bottom surface of this layer the dielectric layer 25 is placed, in which the signal conductor 23 is embedded. Finally, on the bottom surface of the dielectric layer 23 there is another electrically conducting layer 49 forming a second ground layer. The signal conductor 23 can be made impedance matched by choosing the thickness and the dielectric constant of the dielectric layer 25 in a suitable way. The second ground layer 49 is patterned to form an island 51, which is electrically isolated from the rest of the layer, at the place where the via 27 and the contact area 20 are formed. The electrically conductive island 51 has a hole, where the vias 27 are formed. From the hole there extends a continuation hole up into the dielectric layer 25 to end at the signal conductor 23. The walls of the hole are coated with electrically conductive material to form the via 27. On another portion of the islands 51 electrically conducting contact bumps, contact projections or platforms 53 are located, the surfaces of which can be gold-plated. The lower surfaces of the contact bumps 51 form the contact areas 20 which are in mechanical and electrical contact with the electrical conductors 17 extending up to the peak of the top bumps 15.

The portion of an electrical signal path through the connecting structure of FIGS. 1 and 2 which cannot be made impedance matched are the via 19, the electrical conductor 17 on the side and top portion of the top bumps 15, the contact bump 53, the island 51 and the via 27. For a height of the top elastic bumps 15 of typically 30–50 $\mu$m the electrical conductor 17 thereon can have a length of 100–150 $\mu$m. The other portions have dimensions corresponding to the thickness of the various dielectric and conductive layers on the substrate which are typically comprised in the range of 2–10 $\mu$m. Thus the entire non-impedance matched portion can have a length well smaller than 200 $\mu$m which will not normally affect the quality of a signal transmitted on a line.

Connector strips 21 as described above can be installed for interconnecting all opposite substrates of two interconnected multi-layer multichip modules or for interconnecting only one or some of the substrates.

Figure 3:
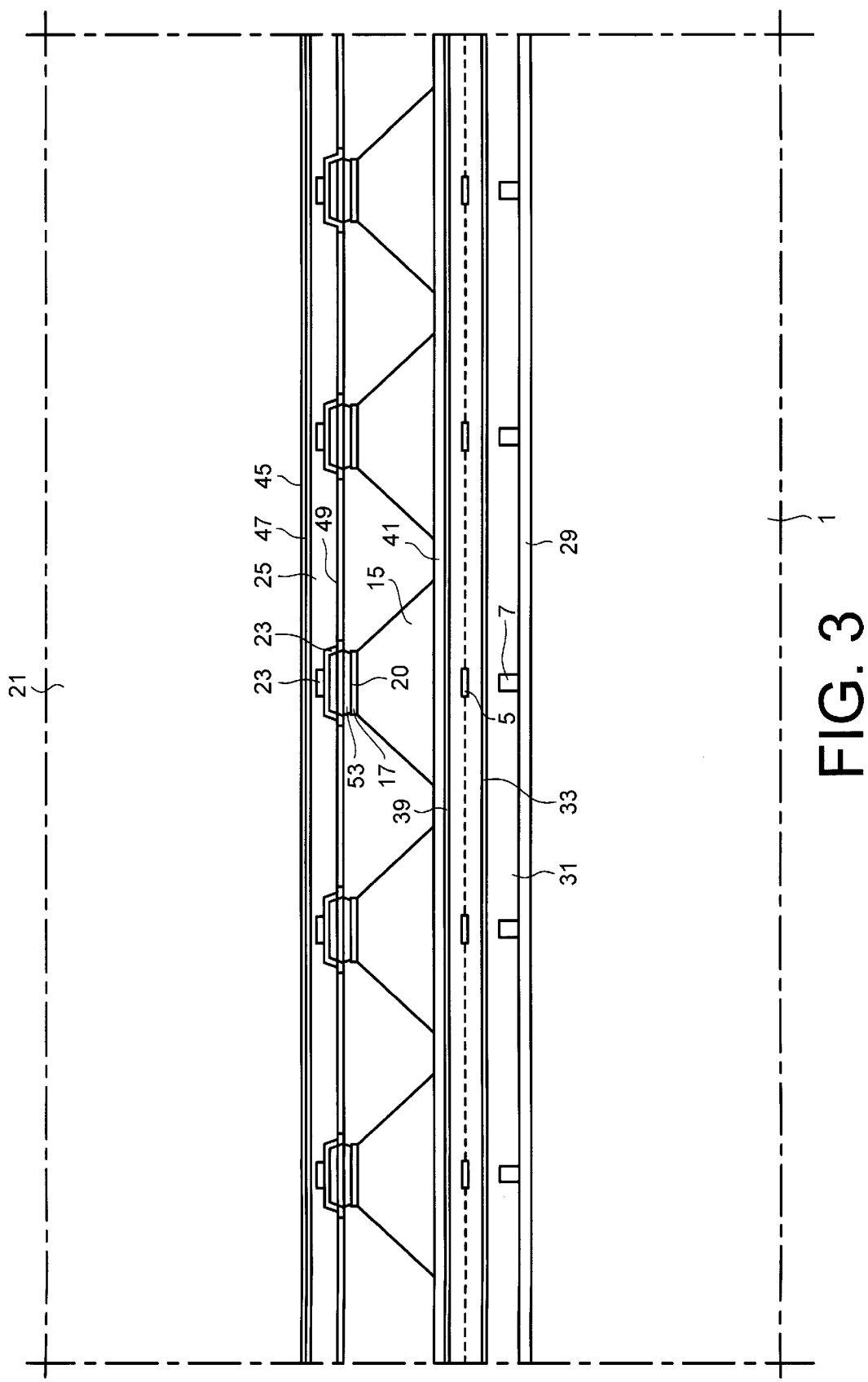
FIG. 3 is a cross-sectional view along the line III—III of FIG. 2 of a portion of the interconnection region, the cross section being parallel to the connection sides of the interconnected three-dimensional multi-chip modules.
Figure 4:
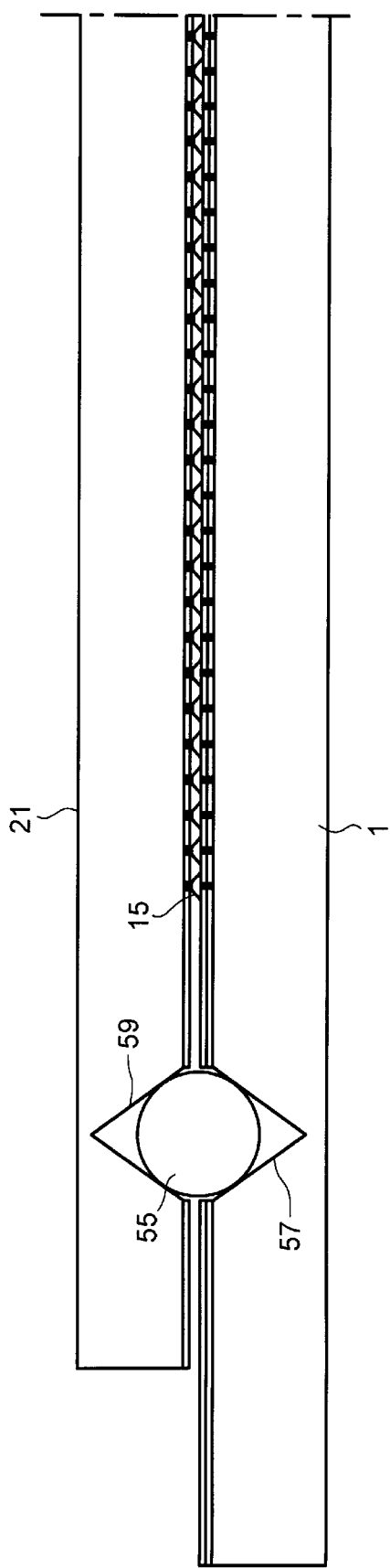
FIG. 4 is a cross-sectional view similar to that of FIG. 3 but showing in a larger scale in particular alignment means for the interconnectors.

FIGS. 3 and 4 are partial cross-sectional views taken in a plane parallel to the substrate end surfaces 3, showing a side portion of the connector substrate 21 and a central portion, respectively.

Thus, in FIGS. 3 and 4 the bus structure of the interconnection region is visible where a number of parallel electrical signal conductors 5 extend tip to the marginal region, each electrical signal conductor 5 having an optical waveguide located therebelow. The conductors 5 are placed with an equal or uniform spacing or pitch over the central portion of the substrate marginal region. Also, there is one individual top bump 15 for each pair of electrical signal line—optical waveguide. Of course, instead of the top bumps 15 a single ridge or rib of elastic behaviour to the bumps resulting in a contiguous layer or a single elastically coated region but such an embodiment would probably give a somewhat less individually elastic behaviour to the bumps resulting in worse contacting characteristics. The smallest allowable spacing distance between parallel conductors will only be determined by the desired electrical transmission characteristics of the conductor lines. The connector structure will allow the individual parallel connectors to continue in a substantially straight manner past the border between two substrates, i.e. all the way along in planes perpendicular to the border plane and to the large surfaces of the substrates.

FIG. 4 shows alignment means for positioning a connector substrate 21 in the correct position along the edge of a substrate 1. The alignment means comprise a guide pin 55 applied between two V-grooves, a V-groove 57 in the top surface of the substrate 1 and a V-groove 59 in the bottom surface of the connector substrate 21. The V-grooves extend in a direction perpendicular to the interconnection region, i.e. perpendicular to the end surface 3 of the substrate 1 or parallel to the end surfaces of the connector strips 21, see FIGS. 1 and 5. The guide pin and the V-grooves are accurately dimensioned so that the guide pin snugly fits into the hole formed by the grooves, when the connector strip 21 is positioned at the marginal surface of a substrate 1. The hole will have a rhombic cross-section provided that the V-grooves have identical shapes and dimensions. The alignment means can also be designed as one or more bumps, not shown, mating with a V-groove as disclosed in the Swedish patent application No. 9604678-4, "Bumps in grooves for elastic positioning".

Thus, a combined electrical and optical connector has been described which allows very densely packed electrical conductors and optical waveguides to be continued substantially straight on past the border between substrates. Thus, it allows short interspaces or distances between two transmission lines and two waveguides on a multichip module, thereby reducing the demand for space on the module. It is also capable of preserving the signal quality.

The combined optical and electrical connector structure as described herein is particularly well suited for compact semiconductor structures, in which an interconnection is desired between different sub-modules or sub-structures. This is achieved by arranging the contact elements of the connector as described which can be very densely packed. For example the connector as described herein advantageously can be used for interconnecting multi-chip modules of the kind described in the Swedish patent application No. 9604690-9, "A packaging structure for integrated circuits".

Additional advantages and modifications will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents.

What is claimed is:

1. A combined electrical and optical edge contact for compact connection of a part to another part, the parts comprising electrical conductors and/or optical waveguides, the edge contact comprising a layer of an elastic, optically transparent material applied to a first surface of a part, which for interconnection is to be located at a corresponding first surface of another part, the layer being located to cover an end surface of an optical waveguide terminating at the surface, wherein the layer carries an exposed, electrically conducting area connected to an electrical conductor on that part, where the layer is located.

2. A connector unit to be used with a contact as set out in claim 1, comprising an electrically conductive pattern on a surface of the unit, this conductive pattern being adapted to come in electrical contact with an exposed, electrically conducting area of the contact, when the unit is brought to a position at the contact.

3. The connector unit of claim 2, comprising positioning means for positioning the unit in a position to contact the exposed, electrically conducting area.

4. The connector unit of claim 3, wherein the positioning means comprise V-grooves in the surface of one or both of the part and the connector unit.

5. The connector unit of claim 4, wherein the positioning means comprise V-grooves both in the surface of the part and in the surface of the connector unit and further guide pins cooperating with the V-grooves.

6. The connector unit of claim 3, wherein the positioning means comprise positioning bumps at the surface of one or both of the part and the connector unit, the bumps cooperating with edge regions or corner regions of the connector unit and the connector unit respectively.

7. The contact of claim 1, wherein the exposed, electrically conducting area is arranged to come in electrical contact with an electrically conducting area on a connector unit comprising interconnected electrically conducting areas.

8. The contact of claim 7, comprising positioning means for positioning a connector unit in a position to contact the exposed, electrically conducting area.

9. The contact of claim 1, wherein the layer covers also a second surface located perpendicularly to the first surface, the electrically conducting area on the layer being located above this second surface and substantially in parallel therewith, the layer portion carrying the electrically conducting area providing an elastic, sliding electrical contact with a connector unit, when the part and the connector unit are brought together.

10. The contact of claim 1, wherein the layer continues uninterruptedly or contiguously from the first surface to the second surface over a corner or edge formed between these surfaces.

11. The contact of claim 1, comprising a separate or individual elastic layer for each pair of an electrical conductor and optical waveguide extending up to the first surface.

12. A method of manufacturing an interconnection for interconnecting electrical conductors and optical wave guides located on two different parts, in particular two different semiconducting substrates, comprising the steps of:

applying an elastic material to regions at the edges of the two different parts, where the interconnection is to be obtained, so that the elastic material covers the interconnection ends of optical waveguides of the two parts; and placing electrical conductors on top of the elastic material.

* * * * *